United States Patent
Pen

(10) Patent No.: US 10,064,292 B2
(45) Date of Patent: Aug. 28, 2018

(54) RECESSED CAVITY IN PRINTED CIRCUIT BOARD PROTECTED BY LPI

(71) Applicant: Multek Technologies Limited, San Jose, CA (US)

(72) Inventor: Kwan Pen, Guandong (CN)

(73) Assignee: Multek Technologies Limited, San Jose, CA (US)

( * ) Notice: Subject to any disclaimer, the term of this patent is extended or adjusted under 35 U.S.C. 154(b) by 0 days.

(21) Appl. No.: 15/094,372

(22) Filed: Apr. 8, 2016

(65) Prior Publication Data

US 2017/0273195 A1    Sep. 21, 2017

(30) Foreign Application Priority Data

Mar. 21, 2016    (CN) .......................... 2016 1 0161908

(51) Int. Cl.
| | |
|---|---|
| *H05K 3/46* | (2006.01) |
| *H05K 1/11* | (2006.01) |
| *H05K 3/06* | (2006.01) |
| *H05K 1/02* | (2006.01) |
| *H05K 3/42* | (2006.01) |

(52) U.S. Cl.
CPC ......... *H05K 3/4611* (2013.01); *H05K 1/0298* (2013.01); *H05K 1/115* (2013.01); *H05K 3/06* (2013.01); *H05K 3/42* (2013.01); *H05K 3/4697* (2013.01); *H05K 2201/09036* (2013.01)

(58) Field of Classification Search
None
See application file for complete search history.

(56) References Cited

U.S. PATENT DOCUMENTS

| | | | | |
|---|---|---|---|---|
| 3,739,232 A | * | 6/1973 | Grossman | H01L 23/36 257/E21.509 |
| 3,755,061 A | * | 8/1973 | Schurb | B32B 37/00 428/338 |
| 3,834,823 A | * | 9/1974 | Seregely | C09D 11/16 106/31.32 |
| 4,055,424 A | * | 10/1977 | Chu | G03F 1/56 430/14 |
| 4,069,497 A | | 1/1978 | Steidlitz | |
| 4,356,619 A | | 11/1982 | Snyder | |
| 4,447,286 A | * | 5/1984 | Weglin | C23F 1/04 156/251 |
| 4,518,833 A | * | 5/1985 | Watkins | C08K 3/08 200/265 |
| 4,568,629 A | * | 2/1986 | Kinashi | B41N 1/14 101/457 |
| 4,670,351 A | * | 6/1987 | Keane | H05K 1/0313 156/297 |

(Continued)

FOREIGN PATENT DOCUMENTS

| | | |
|---|---|---|
| JP | 2008078454 A | 4/2008 |
| JP | 2015012022 A | 1/2015 |

(Continued)

OTHER PUBLICATIONS

Final office action dated Jun. 27, 2017, U.S. Appl. No. 15/064,437, filed Mar. 8, 2016, applicant.: JL Zhou, 21 pages.

(Continued)

*Primary Examiner* — Dimary Lopez Cruz
*Assistant Examiner* — Muhammed Azam
(74) *Attorney, Agent, or Firm* — Haverstock & Owens LLP

(57) ABSTRACT

A PCB has multiple stacked layers laminated together, the laminated stack includes regular flow prepreg and includes a recessed cavity, a bottom perimeter of which is formed by a photo definable, or photo imageable, polymer structure having a low adhesion to an underlying conductive layer, such as an LPI mixture. The LPI mixture defines cavity dimensions and enables the use of regular flow prepreg in the laminated stack.

12 Claims, 4 Drawing Sheets

(56) References Cited

U.S. PATENT DOCUMENTS

| | | | |
|---|---|---|---|
| 4,691,419 A | 9/1987 | Keeler | |
| 4,711,026 A * | 12/1987 | Swiggett | H05K 3/103 |
| | | | 174/259 |
| 4,712,160 A | 12/1987 | Sato et al. | |
| 4,726,114 A | 2/1988 | Staviski | |
| 4,795,512 A * | 1/1989 | Nakatani | B32B 18/00 |
| | | | 156/89.18 |
| 4,828,961 A * | 5/1989 | Lau | H05K 1/16 |
| | | | 156/89.12 |
| 4,837,408 A * | 6/1989 | Kondo | C03C 17/008 |
| | | | 156/89.18 |
| 4,899,256 A | 2/1990 | Sway-Tin | |
| 4,941,516 A | 7/1990 | Weiswurm | |
| 5,004,639 A | 4/1991 | Desai | |
| 5,101,322 A | 3/1992 | Ghaem et al. | |
| 5,153,050 A * | 10/1992 | Johnston | B32B 37/26 |
| | | | 428/192 |
| 5,227,223 A * | 7/1993 | Morgan | C23C 18/28 |
| | | | 174/257 |
| 5,235,491 A | 8/1993 | Weiss | |
| 5,272,599 A | 12/1993 | Koenan | |
| 5,295,044 A | 3/1994 | Araki et al. | |
| 5,347,712 A * | 9/1994 | Yasuda | H05K 1/115 |
| | | | 174/255 |
| 5,365,403 A | 11/1994 | Vinciarelli et al. | |
| 5,409,884 A * | 4/1995 | Harada | B41M 5/443 |
| | | | 428/32.68 |
| 5,536,677 A | 7/1996 | Hutbacher | |
| 5,784,782 A * | 7/1998 | Boyko | H01L 21/486 |
| | | | 156/289 |
| 5,838,554 A | 11/1998 | Lanni | |
| 5,872,051 A | 2/1999 | Fallon et al. | |
| 5,873,512 A | 2/1999 | Bielick et al. | |
| 5,876,859 A * | 3/1999 | Saxelby, Jr. | H01L 21/4839 |
| | | | 257/E23.067 |
| 5,920,458 A | 7/1999 | Azar | |
| 5,933,324 A | 8/1999 | Barrett | |
| 6,031,281 A * | 2/2000 | Kang | H01L 21/56 |
| | | | 257/676 |
| 6,090,237 A * | 7/2000 | Reynolds | B32B 37/0023 |
| | | | 156/323 |
| 6,189,771 B1 | 2/2001 | Maeda et al. | |
| 6,214,525 B1 * | 4/2001 | Boyko | H01L 21/486 |
| | | | 216/18 |
| 6,243,269 B1 | 6/2001 | Dibene, II et al. | |
| 6,245,595 B1 | 6/2001 | Nguyen | |
| 6,272,015 B1 | 8/2001 | Mangtani | |
| 6,282,092 B1 | 8/2001 | Okamoto et al. | |
| 6,311,139 B1 | 10/2001 | Kuroda et al. | |
| 6,369,328 B1 | 4/2002 | Munakata | |
| 6,549,409 B1 | 4/2003 | Saxelby | |
| 6,775,162 B2 | 8/2004 | Mihai et al. | |
| 6,795,315 B1 | 9/2004 | Wu et al. | |
| 7,037,561 B2 * | 5/2006 | Narita | B41M 3/144 |
| | | | 156/235 |
| 7,208,833 B2 | 4/2007 | Nobori et al. | |
| 7,313,464 B1 | 12/2007 | Perreault | |
| 7,676,775 B2 | 3/2010 | Chen et al. | |
| 7,898,068 B2 * | 3/2011 | Smeys | H01L 21/4853 |
| | | | 257/678 |
| 8,020,292 B1 * | 9/2011 | Kumar | H05K 3/4617 |
| | | | 29/825 |
| 8,042,445 B2 | 10/2011 | Lin | |
| 8,278,565 B2 | 10/2012 | Honjo | |
| 8,519,270 B2 * | 8/2013 | Chang | H05K 3/4697 |
| | | | 174/250 |
| 8,558,116 B2 | 10/2013 | Lee | |
| 8,707,221 B2 | 4/2014 | Durkan | |
| 8,735,739 B2 * | 5/2014 | Ishihara | H05K 3/4691 |
| | | | 174/255 |
| 8,882,954 B2 | 11/2014 | Lee | |
| 8,884,166 B2 * | 11/2014 | Inatani | H05K 3/4697 |
| | | | 174/255 |
| 9,338,899 B2 | 5/2016 | Lee | |
| 2001/0003427 A1 | 6/2001 | Ferguson et al. | |
| 2001/0018263 A1 | 8/2001 | Ochiai et al. | |
| 2002/0008963 A1 | 1/2002 | DiBene, II et al. | |
| 2002/0092160 A1 | 7/2002 | McCullough | |
| 2003/0164077 A1 | 9/2003 | Hill | |
| 2003/0170553 A1 * | 9/2003 | Eberlein | G03G 5/0202 |
| | | | 430/123.4 |
| 2004/0089472 A1 * | 5/2004 | Ninomiya | H01L 23/13 |
| | | | 174/266 |
| 2004/0122606 A1 | 6/2004 | Cohen et al. | |
| 2004/0144527 A1 | 7/2004 | Yang et al. | |
| 2004/0219342 A1 * | 11/2004 | Boggs | H05K 1/112 |
| | | | 428/209 |
| 2005/0005996 A1 * | 1/2005 | Mizutani | H05K 3/0008 |
| | | | 141/25 |
| 2005/0246590 A1 | 11/2005 | Lancaster | |
| 2006/0043567 A1 | 3/2006 | Palanduz | |
| 2006/0132427 A1 | 6/2006 | Weisberg | |
| 2006/0196642 A1 | 9/2006 | Gharib | |
| 2006/0254811 A1 | 11/2006 | Kirstein | |
| 2007/0017697 A1 * | 1/2007 | Hsu | H05K 1/115 |
| | | | 174/255 |
| 2007/0054104 A1 * | 3/2007 | Ittel | B82Y 10/00 |
| | | | 428/292.1 |
| 2007/0177075 A1 * | 8/2007 | Kimoto | A61B 1/00048 |
| | | | 349/110 |
| 2007/0195848 A1 | 8/2007 | Lee | |
| 2007/0246254 A1 * | 10/2007 | Kumar | H05K 3/4614 |
| | | | 174/264 |
| 2007/0273011 A1 | 11/2007 | Singleton et al. | |
| 2008/0217708 A1 * | 9/2008 | Reisner | H01L 23/3121 |
| | | | 257/416 |
| 2008/0253612 A1 | 10/2008 | Reyier | |
| 2008/0301597 A1 | 12/2008 | Chen et al. | |
| 2009/0004438 A1 | 1/2009 | Urakawa | |
| 2009/0257707 A1 * | 10/2009 | Shibata | H05K 1/0274 |
| | | | 385/14 |
| 2009/0265155 A1 | 10/2009 | Yokogawa | |
| 2010/0159765 A1 * | 6/2010 | Jian | B32B 17/04 |
| | | | 442/149 |
| 2010/0181104 A1 | 7/2010 | Hotta | |
| 2010/0288540 A1 * | 11/2010 | Honjo | H05K 1/183 |
| | | | 174/255 |
| 2011/0135248 A1 * | 6/2011 | Langer | G02B 6/138 |
| | | | 385/14 |
| 2011/0163457 A1 * | 7/2011 | Mohan | H01L 21/4853 |
| | | | 257/774 |
| 2011/0307752 A1 | 12/2011 | Fuji et al. | |
| 2012/0181074 A1 | 7/2012 | Ishihara | |
| 2013/0299223 A1 * | 11/2013 | Yoo | H05K 3/4697 |
| | | | 174/259 |
| 2013/0341078 A1 * | 12/2013 | Hardin | H05K 1/0222 |
| | | | 174/267 |
| 2014/0024147 A1 | 1/2014 | Xie | |
| 2014/0301053 A1 | 10/2014 | Lida | |
| 2015/0014029 A1 | 1/2015 | Iwayama | |
| 2015/0047884 A1 | 2/2015 | Nagaura | |
| 2015/0090688 A1 * | 4/2015 | Ajoian | C23F 4/04 |
| | | | 216/13 |
| 2016/0088729 A1 | 3/2016 | Kobuke | |
| 2016/0324012 A1 * | 11/2016 | Qiu | H05K 3/4691 |
| 2017/0265298 A1 * | 9/2017 | Zhang | H05K 1/0298 |

FOREIGN PATENT DOCUMENTS

| | | |
|---|---|---|
| KR | 10-0887133 B1 | 3/2009 |
| KR | 100891814 | 3/2009 |
| KR | 10-0891814 B1 | 4/2009 |

OTHER PUBLICATIONS

Non-Final Office Action, dated Feb. 27, 2018, U.S. Appl. No. 15/087,793, filed Mar. 31, 2016, Applicant: Pui Yin Yu, 11 pages.
Non-Final Office Action, dated Nov. 28, 2017, U.S. Appl. No. 14/995,087, filed Jan. 13, 2016, Applicant: Pui Yin Yu, 11 pages.

(56) References Cited

OTHER PUBLICATIONS

Final office action dated Jul. 25, 2017, U.S. Appl. No. 14/995,087, filed Nov. 13, 2016, applicant.: Pui Yin Yu, 16 pages.
Non-Final office Action dated Nov. 1, 2017, U.S. Appl. No. 15/367,679, filed Dec. 2, 2016, applicant: Joan K. Vrtis, 28 pages.

* cited by examiner

RECESSED CAVITY IN PRINTED CIRCUIT BOARD PROTECTED BY LPI

CROSS-REFERENCE TO RELATED APPLICATION(S)

This application claims priority under 35 U.S.C. § 119(a)-(d) of the Chinese Patent Application No: 201610161908.X, filed Mar. 21, 2016 and titled, "RECESSED CAVITY IN PRINTED CIRCUIT BOARD PROTECTED BY LPI," which is hereby incorporated by reference in its entirety for all purposes.

FIELD OF THE INVENTION

The present invention is generally directed to printed circuit boards. More specifically, the present invention is directed to printed circuit boards having recessed cavities.

BACKGROUND OF THE INVENTION

A printed circuit board (PCB) mechanically supports and electrically connects electronic components using conductive traces, pads and other features etched from electrically conductive sheets, such as copper sheets, laminated onto a non-conductive substrate. Multi-layered printed circuit boards are formed by stacking and laminating multiple such etched conductive sheet/non-conductive substrate. Conductors on different layers are interconnected with plated-through holes called vias.

A printed circuit board includes a plurality of stacked layers, the layers made of alternating non-conductive layers and conductive layers. The non-conductive layers can be made of prepreg or base material that is part of a core structure, or simply core. Prepreg is a fibrous reinforcement material impregnated or coated with a resin binder, and consolidated and cured to an intermediate stage semi-solid product. Prepreg is used as an adhesive layer to bond discrete layers of multilayer PCB construction, where a multilayer PCB consists of alternative layers of conductors and base materials bonded together, including at least one internal conductive layer. A base material is an organic or inorganic material used to support a pattern of conductor material. A core is a metal clad base material where the base material has integral metal conductor material on one or both sides. A laminated stack is formed by stacking multiple core structures with intervening prepreg and then laminating the stack. A via is then formed by drilling a hole through the laminated stack and plating the wall of the hole with electrically conductive material, such as copper. The resulting plating interconnects the conductive layers in the laminated stack.

In order to lower overall board thickness after assembly, inclusion of a recessed cavity in the PCB is getting more attention in consumer electronic and telecommunication products. Common fabrication process is to pre-cut low flow prepreg at a cavity area and then control resin squeeze out during the lamination process. This process has disadvantages such as high cost of low flow prepreg, limited supply of low flow prepreg and difficulty in controlling resin squeeze out into the cavity. Additionally, lamination accessories such as release film and conformal film are needed which also add cost. Release film provides a separation between a surface copper layer (conducting layer) in the lamination stack and the conformal film. Conformal film is a thermoplastic layer which softens under lamination temperature and conforms to the area with prepreg pre-cut. Use of low flow prepreg requires higher lamination pressure. Lamination under high pressure and the impact of conformal film can result in increased panel distortion and it is difficult to achieve flat surface for fine line etching or even dielectric thickness across the panel to control impedance. A panel here refers to the finished product of the stack of laminate and prepreg after lamination. In order to solve these issues, a new manufacturing process for forming a cavity within a PCB is needed.

SUMMARY OF THE INVENTION

Embodiments are directed to a PCB having a recessed cavity having a photo definable, or photo imageable, polymer structure at a bottom perimeter of the cavity side wall. In some embodiments, the photo imageable polymer structure is a liquid photoimage ink (LPI) mixture. The LPI mixture is an LPI mixed with up to 10% by weight silicone base release agent. The PCB has multiple stacked layers laminated together. The laminated stack includes regular flow prepreg and includes a recessed cavity. A residual of the LPI mixture is present at a bottom portion of the cavity. The LPI mixture is applied on a surface of a core structure, on top of which is to be formed a cavity area, and then exposed and developed. This LPI mixture layer prevents direct contact of prepreg and a bottom surface of the subsequent cavity area in the lamination process. After lamination, a decap process is performed to remove a portion of the laminated stack, the portion referred to as a plug, corresponding to the cavity area. The decap process can include mechanical routing or mechanical plus laser routing at a cavity boundary and the plug is pulled out, thereby forming the cavity. LPI mixture remaining at the cavity bottom surface is substantially stripped away by chemical stripping process, although a lateral portion of the LPI mixture layer remains within the cavity side wall at the bottom of the cavity. The cavity can be formed either with or without plating on the exposed surfaces. In this process, there is no need to control resin squeeze out nor a limitation in prepreg selection. Further, without use of lamination accessories or high lamination pressure, panel distortion and surface flatness are improved.

In an aspect, a printed circuit board is disclosed. The printed circuit board includes a laminated stack and a photo imageable polymer structure formed within the laminated stack. The laminated stack comprises a plurality of non-conductive layers and a plurality of conductive layers. A recessed cavity is formed in the laminated stack, the recessed cavity having cavity side walls and a cavity bottom surface. The photo imageable structure forms a perimeter boundary of the recessed cavity within the cavity side walls adjacent to the cavity bottom surface. In some embodiments, the recessed cavity is formed from an outer surface of the laminated stack into the laminated stack. In some embodiments, the photo imageable polymer structure is a liquid photoimage ink (LPI) mixture comprising an LPI mixed with up to 10% by weight silicone base release agent. In some embodiments, the photo imageable polymer structure is formed on a surface of one of the plurality of conductive layers. In some embodiments, the photo imageable polymer structure includes a release agent enabling the photo imageable polymer structure to be pulled apart from the conductive layer after lamination. In some embodiments, one or more of the plurality of non-conductive layers comprise a prepreg layer. In some embodiments, the prepreg layer comprises a regular flow prepreg layer having resin flow greater than about 100 mil. In some embodiments, each of the conductive layers is pattern etched. In some embodiments, the printed circuit board further comprises one or more plated through hole vias in the laminated stack. In some embodiments, the cavity bottom surface comprises a conductive layer. In some embodiments, surfaces of the cavity side walls are non-plated. In some embodiments, surfaces of the cavity side walls are plated.

In another aspect, a method of manufacturing a printed circuit board is disclosed. The method includes forming an inner core structure having a first surface of conductive material, and forming a photo imageable polymer structure on the first surface of the inner core structure. The photo imageable polymer structure forms a boundary within which a footprint of a recessed cavity is to be formed. The method also includes forming a printed circuit board stack up. The printed circuit board stack up comprises the inner core structure, a plurality of non-conductive layers and a plurality of conductive layers. The method also includes laminating the printed circuit board stack up, thereby forming a laminated stack. The method also includes a depth controlled rout from a surface of the laminated stack to the first surface of conductive material and within the boundary of the photo imageable polymer structure at the footprint. A portion of the laminated stack within a perimeter of the rout and to the depth of the rout forms a laminated stack plug. The method also includes removing the laminated stack plug, thereby forming the recessed cavity. In some embodiments, the method also includes forming at least one plated through hole via in the laminated stack, wherein the at least one plated through hole via is not aligned within the cavity. In some embodiments, the method also includes pattern etching the conductive layers in the laminated stack prior to forming the printed circuit board stack up. In some embodiments, forming the inner core structure comprises applying a first conductive layer on a first surface of a non-conductive layer. In some embodiments, the first conductive layer is pattern etched thereby forming the first surface of conductive material onto which the photo imageable polymer structure is formed. In some embodiments, one or more of the non-conductive layers comprise one or more regular flow prepreg layers. In some embodiments, laminating the printed circuit board stack up comprises applying a standard lamination pressure less than about 450 psi. In some embodiments, the method also includes performing a stripping step to remove residual photo imageable polymer structure material at a bottom surface of the cavity after the laminated stack plug is removed. In some embodiments, the method also includes plating all surfaces of the recessed cavity. In some embodiments, the photo imageable polymer structure includes a release agent enabling removing the laminated stack plug by pulling apart the photo imageable polymer structure from the first surface of conductive material.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures.

DETAILED DESCRIPTION OF THE EMBODIMENTS

Embodiments of the present application are directed to a printed circuit board. Those of ordinary skill in the art will realize that the following detailed description of the printed circuit board is illustrative only and is not intended to be in any way limiting. Other embodiments of the printed circuit board will readily suggest themselves to such skilled persons having the benefit of this disclosure.

Reference will now be made in detail to implementations of the printed circuit board as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1:
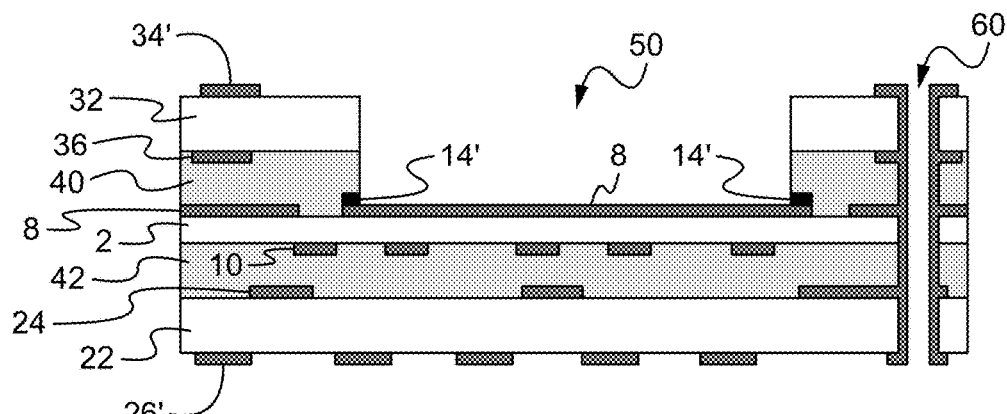
FIG. 1 illustrates a cut-out side view of a PCB including an embedded cavity according to some embodiments.

FIG. 1 illustrates a cut out side view of a PCB including a recessed cavity according to some embodiments. The PCB is a laminated stack having a plurality of non-conductive layers and a plurality of conductive layers. In the exemplary configuration shown in FIG. 1, the PCB includes conductive layers 8, 10, 24, 26', 34' and 36 and non-conductive layers 2, 22, 32, 40 and 42. Each conductive layer is patterned to form electrically conductive interconnects. Although not shown in FIG. 1, electrically conductive vias can be formed in the laminated stack to electrically interconnect one or more conductive layers. A conductive layer can be formed, for example, from a copper foil or laminate, where a laminate includes a non-conductive layer such as base material and a conductive layer on one or both sides of non-conductive layer. In some embodiments, a conductive layer is representative of a multilayer buildup that can include many interspersed conductive and non-conductive layers.

Each non-conductive layer is made of a non-conductive, insulating layer, such as prepreg or base material. The prepreg used herein is a regular flow prepreg, which enables a regular pressure to be used during a subsequent lamination step. In the PCB industry, "low flow" prepreg, such as that described in the background, is a general term to describe prepreg with lower resin flow than "regular flow" prepreg. "Low flow" prepreg usually has resin flow that is less than 100 mil. "Regular flow" prepreg has resin flow that is greater than 100 mil. A base material is an organic or inorganic material used to support a pattern of conductor material. Base material and prepreg each include resin and glass cloth, but the resin in base material is already fully cured and as such does not flow during lamination. The resin in prepreg is only partially cured and therefore flows during lamination. It is understood that the number of non-conductive layers and conductive layers shown in FIG. 1 is merely a design choice and that fewer or greater numbers of non-conductive layers and conductive layers can be included.

Prior to stack-up and lamination of the printed circuit board layers, photo definable, or photo imageable, polymer structure is added onto a portion of one of the conductive layers. In some embodiments, the photo imageable polymer structure is a liquid photoimage ink (LPI) mixture. Subsequent description is directed to an LPI mixture, but it is understood that the LPI mixture can be replaced with alternative suitable photo imageable polymer structure. The area of the applied LPI mixture substantially corresponds to a bottom surface of a subsequently formed cavity. The LPI mixture is an LPI mixed with up to 10% by weight silicone base release agent. The LPI mixture has a low adhesion to the underlying conductive layer. In some embodiments, the conductive layers are copper. The LPI mixture is applied on a surface of the conductive layer, then exposed and developed. In some embodiments, LPI includes a resin, a photo-activator or photo-initiator, and cross-linking agents that upon being subject to light become solid and remain attached to an underlying substrate. Any material not subject to light is easily washed away. In some embodiments, photolithography is used as a process for forming the LPI mixture layer. It is understood that other conventional processes can be used.

The LPI mixture layer prevents direct contact of prepreg and a bottom surface of the subsequent cavity area in the lamination process. To ensure that the entire area of the cavity is formed, the LPI mixture is applied in an area that is slightly greater than the bottom surface area of the to be formed cavity. After lamination, a decap process is performed to remove a portion of the laminated stack, the portion referred to as a plug, corresponding to the cavity area. The decap process can include mechanical routing or mechanical plus laser routing at a cavity boundary and the plug is pulled out enabled by the low adhesion between the LPI mixture and the underlying conductive layer that forms the bottom surface of the cavity. LPI mixture remaining at the cavity bottom surface is substantially stripped away by chemical stripping process. The cavity boundary is routed within a perimeter boundary of the LPI mixture layer. As such, removal of the plug leaves intact a small perimeter portion of the LPI mixture layer in the side wall of the cavity adjacent to the cavity bottom surface. Such a remaining perimeter portion of the LPI mixture layer is shown in FIG. 1 as LPI mixture layer 14' in the side wall of the cavity 50.

In the exemplary configuration shown in FIG. 1, a depth of the cavity 50 is a function of the thicknesses of the non-conductive layers 32 and 40. It is understood that the depth of the cavity can be varied by varying the thicknesses of the non-conductive layers 32 and 40 and/or by adding additional non-conductive layers between the LPI mixture layer and the outer surface of the laminated stack into which the cavity is formed. A cross-sectional area of the cavity can be increased or decreased by increasing or decreasing the area onto which the LPI mixture layer is applied. Similarly, a cross-sectional shape of the cavity is determined by a shape of the LPI mixture layer, for example as a rectangle or a circle.

Figure 2:
FIGS. 2-8 illustrate various steps in the process used to manufacture a PCB according to some embodiments.

The cavity can be formed either with or without plating on the exposed surfaces. FIGS. 2-8 illustrate various steps in the process used to manufacture a PCB having a recessed cavity wall without plating according to some embodiments. The PCB manufactured using the various steps shown in FIGS. 2-8 is similar to and shares features of the PCB and constituent layers shown in FIG. 1. Each of the FIGS. 2-8 illustrate a cut out side view of the PCB according to the various process steps. In FIG. 2, an exemplary inner core structure is shown. The inner core structure is a metal clad structure including the non-conductive layer 2 and conductive layers 4, 6 formed on both opposing surfaces. It is understood that an alternative inner core structure can be used which includes a conductive layer on only one surface of the non-conductive layer.

Figure 3:
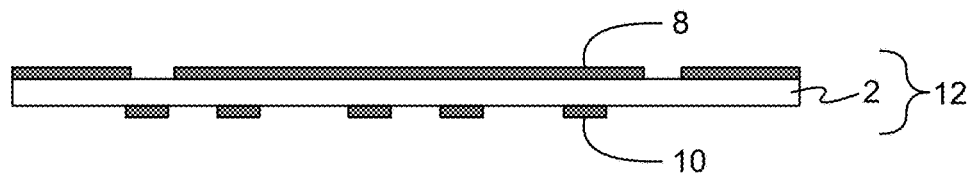

In FIG. 3, the conductive layers 4 and 6 are selectively pattern etched to form inner core circuitry 8 and 10, respectively. A select portion of the inner core circuitry 8 subsequently forms a bottom surface of the recessed cavity. Alternatively, the conductive layers 4, 6 are already pattern etched during fabrication of the inner core structure in FIG. 2. It is understood that FIG. 2-8 only show a portion of the PCB and in particular only show a portion of the inner core structure. Additional interconnects and circuitry may be formed on portions of the inner core structure not shown in FIGS. 2-8. The non-conductive layer 2 and the inner core circuitry 8, 10 form inner core structure 12.

Figure 4:

In FIG. 4, the LPI mixture layer 14 is formed on the inner core structure 12. In particular, the LPI mixture is formed on a portion of the conductive layer of the inner core structure, as shown in FIG. 4. As shown in FIG. 4, a footprint of the LPI mixture layer 14 matches a footprint of the underlying portion of the inner core circuitry 8. Alternatively, the footprint of the LPI mixture layer 14 is smaller than a footprint of the underlying portion of the inner core circuitry 8.

Figure 5:
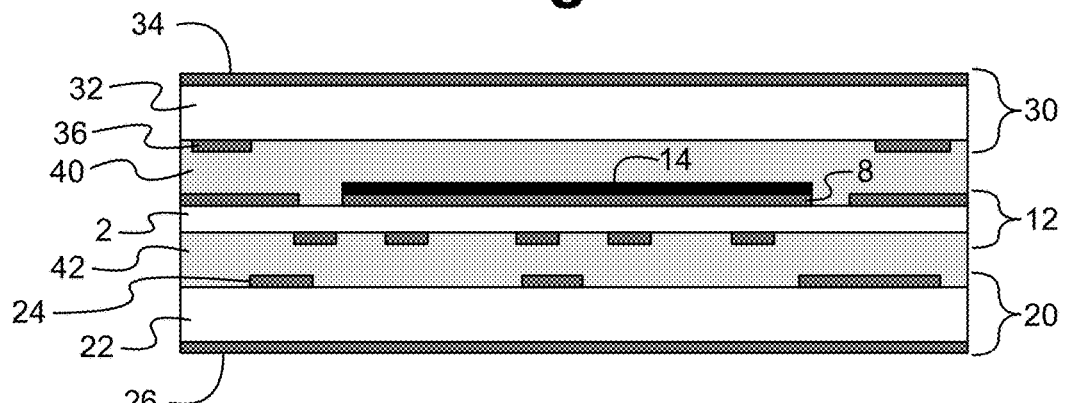

In FIG. 5, additional core structures are fabricated. The additional core structures can be similar to the inner core structure 12 of FIG. 3 with the conductive layers pattern etched accordingly. In most instances, the additional core structures are made using a non-conductive base material. In the exemplary configuration shown in FIG. 5, two additional core structures 20 and 30 are included. The core structure 20 is a metal clad structure including a non-conductive layer 22 and conductive layers 24, 26 formed on both opposing surfaces. The conductive layer 24 is selectively pattern etched. The core structure 30 is a metal clad structure including a non-conductive layer 32 and conductive layers 34, 36 formed on both opposing surfaces. The conductive layer 36 is selectively pattern etched. It is understood that alternatively configured core structures can be used which include a conductive layer on only one surface of the non-conductive layer.

The inner core structure 12 with LPI mixture layer 14, the core structure 20 and the core structure 30 are stacked with intervening non-conductive layers, such as regular flow prepreg layers 40 and 42. As described above, the dimensions of the cavity are determined by the thicknesses and numbers of non-conductive layers between the LPI mixture layer and the outer surface of the laminated stack into which the cavity is formed, as well as the position and shape of the LPI mixture layer.

A single lamination step using standard lamination pressure results in the laminated stack shown in FIG. 5. Any conventional lamination technique can be used. As used herein, standard lamination pressure refers to the lamination pressure used with "regular flow" prepreg. With "regular flow" prepreg, lamination pressure is less than about 450 psi. With "low flow" prepreg, lamination pressure is more than about 450 psi.

Figure 6:
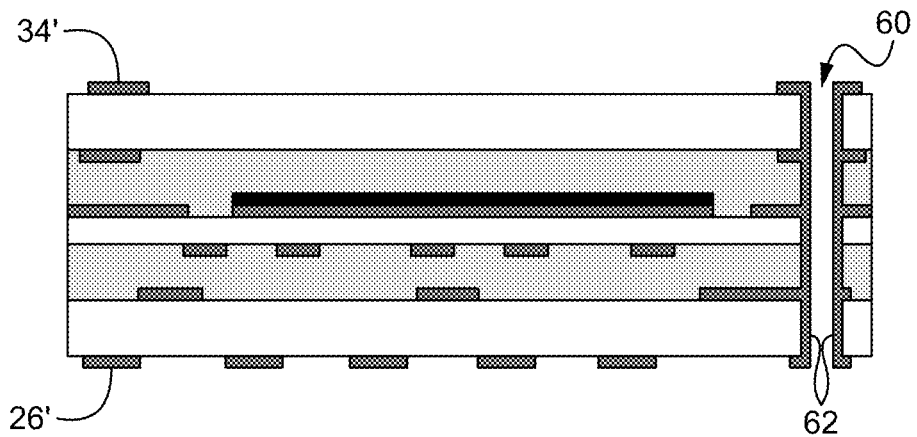

In FIG. 6, selective holes are drilled through the laminated stack of FIG. 5 to form vias, such as via 60. Vias can be formed in those portions of the PCB not corresponding to a cavity. A desmear process is performed to remove residue, such as residual particles from the drilling of via 60. Next, an electroless plating process is performed to form plating 62 on the side walls of the via 60. In some embodiments, copper is used as the plating material. It is understood that other plating materials can be used. The plating 62 forms an interconnect with various conductive layers in the stack. Next, an outer conductive layer etching process is performed. The conductive layers 34 and 26 on the top and bottom, respectively, of the laminated stack are pattern etched to form patterned conductive layers 34' and 26'.

Figure 7:
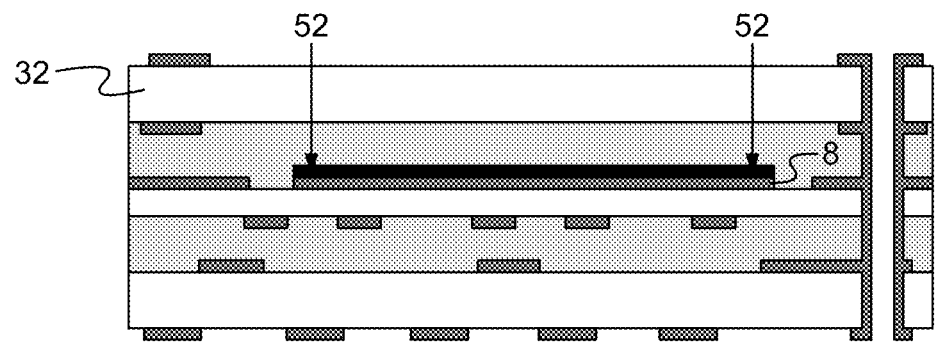

In FIG. 7, a depth controlled rout step is performed. In some embodiments, a routing tool having a rout bit is used to form a rout into the laminated stack to a depth of the conductive layer 8 on the respective inner core structure 12. Alternatively, a mechanical plus laser depth controlled routing process is performed. As shown in FIG. 7, a rout 52 is made from the non-conductive layer 32 to the conductive layer 8 of the inner core structure 12. FIG. 7 shows a two dimensional view of the rout 52. In three-dimensions, the rout 52 is formed proximate, and preferably slightly within, an outer perimeter of the LPI mixture layer 14.

Figure 8:
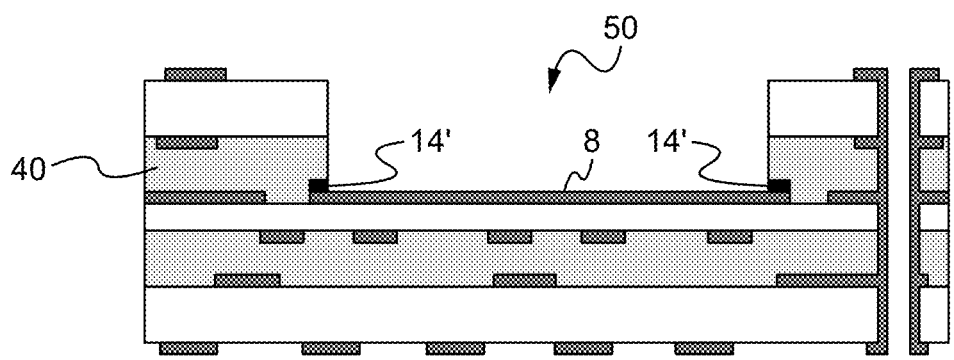

In FIG. 8, a plug is removed from the laminated stack, thereby forming the cavity 50. The plug is the area within the rout 52 perimeter and between the non-conducive layer 32 and the conductive layer 8 of the inner core structure 12. Removal of the plug is referred to as a decap process. The low adhesion between the LPI mixture layer 14 and the underlying conductive layer 8 enables the plug to simply be pulled apart from the conductive layer 8. Use of conventional LPI would not enable such a decap process as the adhesion between conventional LPI and copper is sufficient to prevent pulling apart of the two layers. Inclusion of a sufficient amount of silicone base release agent reduces the adhesion to enable pulling apart of the LPI mixture layer and the copper layer. It is understood that alternative types of release agents can be added to the LPI to form the appropriate low adhesion LPI mixture for pulling apart from an underlying conductive layer. In some embodiments, a residual layer of LPI mixture remains on the surface of the conductive layer 8 after the decap process. In this case, an LPI mixture stripping step is performed, thereby exposing the conductive layer 8 as the bottom surface of the cavity 50.

Figure 9:
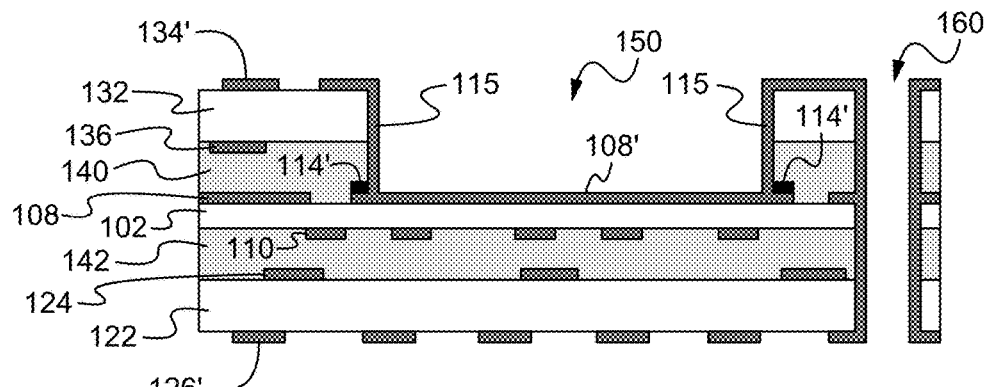
FIG. 9 illustrates a cut out side view of a PCB including a recessed cavity according to other embodiments.

A recessed cavity can also be formed with plating on the exposed surfaces. FIG. 9 illustrates a cut out side view of a PCB including a recessed cavity according to other embodiments. The PCB shown in FIG. 9 is similar to the PCB of FIG. 1 except the recessed cavity 150 in the PCB of FIG. 9 includes plating on the exposed surfaces, such as side wall plating 115 and bottom surface plating 108'. Similar to the PCB in FIG. 1, the PCB in FIG. 9 is a laminated stack having a plurality of non-conductive layers and a plurality of conductive layers. In the exemplary configuration shown in FIG. 9, the PCB includes conductive layers 108, 110, 124, 126', 134' and 136 and non-conductive layers 102, 122, 132, 140 and 142. Each conductive layer is patterned to form electrically conductive interconnects. Although not shown in FIG. 9, electrically conductive vias can be formed in the laminated stack to electrically interconnect one or more conductive layers. A remaining perimeter portion of the LPI mixture layer is shown in FIG. 9 as LPI mixture layer 114' in the side wall of the cavity 150. The LPI mixture layer 114' is laterally covered by the side wall plating 115.

Figure 10:
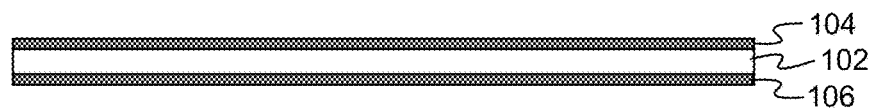
FIGS. 10-17 illustrate various steps in the process used to manufacture a PCB having a recessed cavity wall with plating according to some embodiments.
Figure 11:
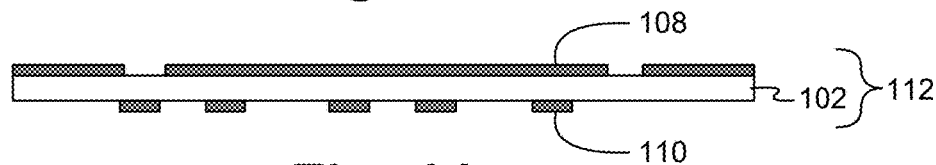

FIGS. 10-17 illustrate various steps in the process used to manufacture a PCB having a recessed cavity wall with plating according to some embodiments. The PCB manufactured using the various steps shown in FIGS. 10-17 is similar to and shares features of the PCB and constituent layers shown in FIG. 9. Each of the FIGS. 10-17 illustrate a cut out side view of the PCB according to the various process steps. In FIG. 10, an exemplary inner core structure is shown. The inner core structure is a metal clad structure including the non-conductive layer 102 and conductive layers 104, 106 formed on both opposing surfaces. It is understood that an alternative inner core structure can be used which includes a conductive layer on only one surface of the non-conductive layer.

In FIG. 10, the conductive layers 104 and 106 are selectively pattern etched to form inner core circuitry 108 and 110, respectively. A select portion of the inner core circuitry 108 subsequently forms a bottom surface of the recessed cavity. Alternatively, the conductive layers 104, 106 are already pattern etched during fabrication of the inner core structure in FIG. 10. It is understood that FIG. 10-17 only show a portion of the PCB and in particular only show a portion of the inner core structure. Additional interconnects and circuitry may be formed on portions of the inner core structure not shown in FIGS. 10-17. The non-conductive layer 102 and the inner core circuitry 108, 110 form inner core structure 112.

Figure 12:

In FIG. 12, the LPI mixture layer 114 is formed on the inner core structure 112. In particular, the LPI mixture is formed on a portion of the conductive layer of the inner core structure, as shown in FIG. 12. As shown in FIG. 12, a footprint of the LPI mixture layer 114 matches a footprint of the underlying portion of the inner core circuitry 108. Alternatively, the footprint of the LPI mixture layer 114 is smaller than a footprint of the underlying portion of the inner core circuitry 108.

Figure 13:
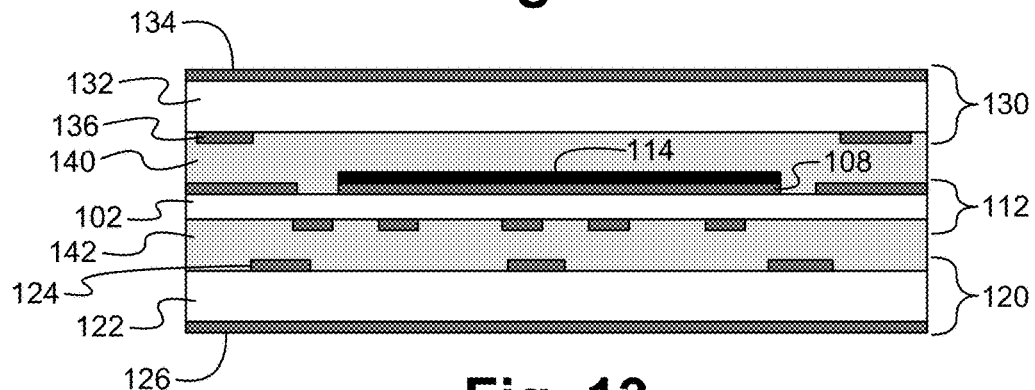

In FIG. 13, additional core structures are fabricated. The additional core structures can be similar to the inner core structure 112 of FIG. 11 with the conductive layers pattern etched accordingly. In most instances, the additional core structures are made using a non-conductive base material. In the exemplary configuration shown in FIG. 13, two additional core structures 120 and 130 are included. The core structure 120 is a metal clad structure including a non-conductive layer 122 and conductive layers 124, 126 formed on both opposing surfaces. The conductive layer 124 is selectively pattern etched. The core structure 130 is a metal clad structure including a non-conductive layer 132 and conductive layers 134, 136 formed on both opposing surfaces. The conductive layer 136 is selectively pattern etched. It is understood that alternatively configured core structures can be used which include a conductive layer on only one surface of the non-conductive layer.

The inner core structure 112 with LPI mixture layer 114, the core structure 120 and the core structure 130 are stacked with intervening non-conductive layers, such as regular flow prepreg layers 140 and 142. As described above, the dimensions of the cavity are determined by the thicknesses and numbers of non-conductive layers between the LPI mixture layer and the outer surface of the laminated stack into which the cavity is formed, as well as the position and shape of the LPI mixture layer.

A single lamination step using standard lamination pressure results in the laminated stack shown in FIG. 13. Any conventional lamination technique can be used.

Figure 14:
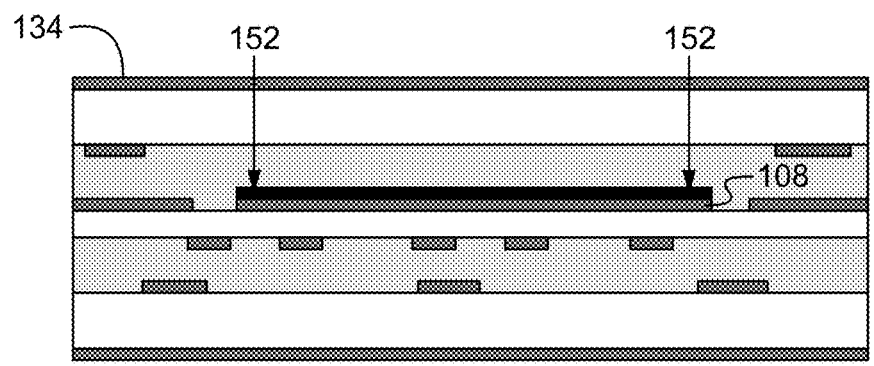

In FIG. 14, a depth controlled rout step is performed. In some embodiments, a routing tool having a rout bit is used to form a rout into the laminated stack to a depth of the conductive layer 108 on the respective inner core structure 112. Alternatively, a mechanical plus laser depth controlled routing process is performed. As shown in FIG. 14, a rout 152 is made from the conductive layer 134 to the conductive layer 108 of the inner core structure 112. FIG. 14 shows a two dimensional view of the rout 152. In three-dimensions, the rout 152 is formed proximate, and preferably slightly within, an outer perimeter of the LPI mixture layer 114.

Figure 15:
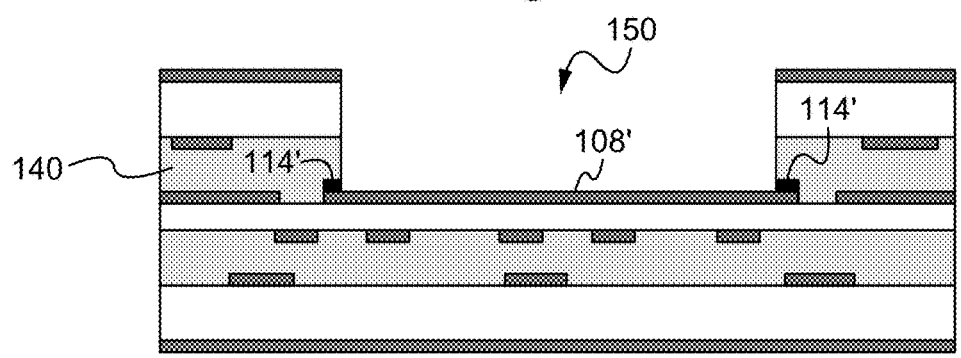

In FIG. 15, a plug is removed from the laminated stack, thereby forming the cavity 150. The plug is the area within the rout 152 perimeter and between the conducive layer 134 and the conductive layer 108 of the inner core structure 112. The low adhesion between the LPI mixture layer 114 and the underlying conductive layer 108 enables the plug to simply be pulled apart from the conductive layer 108. In some embodiments, a residual layer of LPI mixture remains on the surface of the conductive layer 108 after the decap process. In this case, an LPI mixture stripping step is performed, thereby exposing the conductive layer 108 as the bottom surface of the cavity 150.

Figure 16:
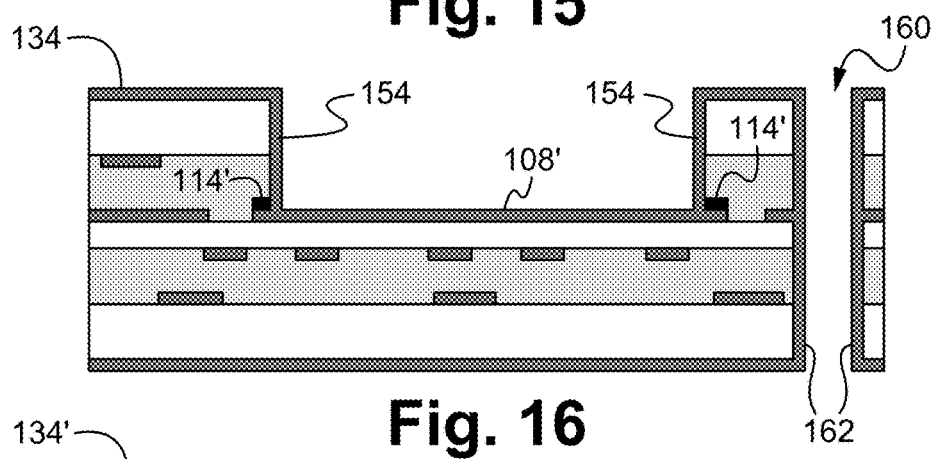

In FIG. 16, selective holes are drilled through the laminated stack of FIG. 15 to form vias, such as via 160. Vias can be formed in those portions of the PCB not corresponding to a cavity. A desmear process is performed to remove residue, such as residual particles from the drilling of via 160. Next, an electroless plating process is performed to form plating 162 on the side walls of the via 160. The plating process also plates the exposed surfaces within the cavity 150 to form cavity side wall plating 154 and cavity bottom surface plating 108' on the conductive layer 108. In some embodiments, copper is used as the plating material. It is understood that other plating materials can be used. The plating 162, cavity side wall plating 154 and cavity bottom surface plating 108' form interconnects with various conductive layers in the stack.

Figure 17:
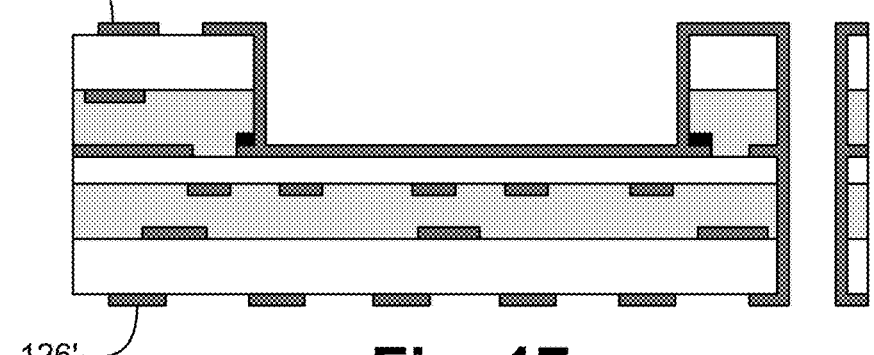

In FIG. 17, an outer conductive layer etching process is performed. The conductive layers 134 and 126 on the top and bottom, respectively, of the laminated stack are pattern etched to form patterned conductive layers 134' and 126'.

It is understood that the various structural configurations shown in the embodiments of FIGS. 1-17 and the position of the recessed cavity can be different according to a specific application and application requirement.

The PCB and manufacturing processes described herein provided numerous advantages. The PCB having a LPI mixture layer to form a recessed cavity is formed using regular flow prepreg. In prior art PCBs, a PCB having a recessed cavity is formed using low flow prepreg as well as lamination accessories such as release film and conformal film. Use of low flow prepreg is needed to control squeeze out during lamination. However, since low flow prepreg is used, a greater lamination pressure is required which results in surface ripple on the PCB exterior surfaces. Under high pressure the underlying topography of the inner layer circuitry is reflected on the surface resulting in the irregular, or rippled, surface. In the present application, there is no need to control resin squeeze out, there is no limitation in prepreg selection, and there is no need of lamination accessories or high lamination pressure, which results in a flat exterior surfaces. The present process improves board flatness that solves impedance control issues and improves reliability of surface mounted component connections. Yield of fine line 2/2 mil etching and solder mask fine line imaging is also improved because of the flat exterior surfaces. Without use of lamination accessories and with yield improvement, the process of the present application saves running cost dramatically. Higher pressure lamination as used in conventional processes leads to expansion in the X-Y plane of the PCB. Such lateral expansion moves surface contact pads relative to their designed positions. The present process uses standard lamination pressure and therefore reduces lateral expansion. Such dimensional control is becoming more and more significant with smaller and smaller pitch components to be surface mounted.

The present application has been described in terms of specific embodiments incorporating details to facilitate the understanding of the principles of construction and operation of the printed circuit board. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed is:

1. A printed circuit board comprising:
   a laminated stack comprising a plurality of non-conductive layers and a plurality of conductive layers, wherein a recessed cavity is formed in the laminated stack, the recessed cavity having cavity side walls and a cavity bottom surface; and
   a photo imageable polymer structure formed within the laminated stack, wherein the photo imageable structure forms a perimeter boundary of the recessed cavity within the cavity side walls adjacent to the cavity bottom surface.

2. The printed circuit board of claim 1 wherein the recessed cavity is formed from an outer surface of the laminated stack into the laminated stack.

3. The printed circuit board of claim 1 wherein the photo imageable polymer structure is a liquid photoimage ink (LPI) mixture comprising an LPI mixed with up to 10% by weight silicone base release agent.

4. The printed circuit board of claim 1 wherein the photo imageable polymer structure is formed on a surface of one of the plurality of conductive layers.

5. The printed circuit board of claim 4 wherein the photo imageable polymer structure includes a release agent enabling the photo imageable polymer structure to be pulled apart from the conductive layer after lamination.

6. The printed circuit board of claim 1 wherein one or more of the plurality of non-conductive layers comprise a prepreg layer.

7. The printed circuit board of claim 6 wherein the prepreg layer comprises a regular flow prepreg layer having resin flow greater than about 100 mil.

8. The printed circuit board of claim 1 wherein each of the conductive layers is pattern etched.

9. The printed circuit board of claim 1 further comprising one or more plated through hole vias in the laminated stack.

10. The printed circuit board of claim 1 wherein the cavity bottom surface comprises a conductive layer.

11. The printed circuit board of claim 10 wherein surfaces of the cavity side walls are non-plated.

12. The printed circuit board of claim 10 wherein surfaces of the cavity side walls are plated.

* * * * *